(12) United States Patent
Kikkawa

(10) Patent No.: US 9,299,822 B2
(45) Date of Patent: Mar. 29, 2016

(54) SEMICONDUCTOR DEVICE AND MANUFACTURING METHOD OF SEMICONDUCTOR DEVICE

(71) Applicant: Transphorm Japan, Inc., Yokohama, Kanagawa (JP)

(72) Inventor: Toshihide Kikkawa, Machida (JP)

(73) Assignee: Transphorm Japan, Inc., Yokohama (JP)

( * ) Notice: Subject to any disclaimer, the term of this patent is extended or adjusted under 35 U.S.C. 154(b) by 0 days.

(21) Appl. No.: 13/943,874

(22) Filed: Jul. 17, 2013

(65) Prior Publication Data

US 2014/0091316 A1    Apr. 3, 2014

(30) Foreign Application Priority Data

Sep. 28, 2012  (JP) ................. 2012-218244

(51) Int. Cl.
  *H01L 29/778*  (2006.01)
  *H01L 29/66*   (2006.01)
  *H01L 29/20*   (2006.01)

(52) U.S. Cl.
  CPC ........ *H01L 29/778* (2013.01); *H01L 29/66431* (2013.01); *H01L 29/66462* (2013.01); *H01L 29/7787* (2013.01); *H01L 29/2003* (2013.01)

(58) Field of Classification Search
  CPC .............. H01L 29/7787; H01L 29/66462; H01L 29/1029; H01L 29/2003; H01L 31/0264; H01L 31/0328; H01L 27/338
  USPC ..................... 363/17; 257/194, 103
  See application file for complete search history.

(56) References Cited

U.S. PATENT DOCUMENTS

2004/0201038 A1*  10/2004  Kimura et al. ................ 257/192
2010/0051962 A1    3/2010  Kikkawa et al.
(Continued)

FOREIGN PATENT DOCUMENTS

CN   102646705    8/2012
JP   2002-359256  12/2002
(Continued)

OTHER PUBLICATIONS

Arulkumaran et al., "Studies on the Influences of i-GaN, n-GaN, p-GaN, and InGaN Cap Layers in AlGaN.GaN HEMTs", JJAP, vol. 44, No. 5A, 2005, pp. 2953-2960.*
(Continued)

*Primary Examiner* — Kenneth Parker
*Assistant Examiner* — Bo Fan
(74) *Attorney, Agent, or Firm* — Fish & Richardson P.C.

(57) ABSTRACT

A semiconductor device includes a first semiconductor layer formed on a substrate; a second semiconductor layer and a third semiconductor layer formed on the first semiconductor layer; a fourth semiconductor layer formed on the third semiconductor layer; a gate electrode formed on the fourth semiconductor layer; and a source electrode and a drain electrode formed in contact with the second semiconductor layer. The third semiconductor layer and the fourth semiconductor layer are formed in an area immediately below the gate electrode, the fourth semiconductor layer is formed with a p-type semiconductor material, and the second semiconductor layer and the third semiconductor layer are formed with AlGaN, and the third semiconductor layer has a lower composition ratio of Al than that of the second semiconductor layer.

10 Claims, 15 Drawing Sheets

(56) References Cited

U.S. PATENT DOCUMENTS

| | | |
|---|---|---|
| 2010/0102357 A1 | 4/2010 | Sato |
| 2011/0068370 A1 | 3/2011 | Kim et al. |

FOREIGN PATENT DOCUMENTS

| | | | |
|---|---|---|---|
| JP | 2002359256 A | * | 12/2002 |
| JP | 2010-010584 | | 1/2010 |
| JP | 2010-103425 | | 5/2010 |
| JP | 2010135641 A | * | 6/2010 |
| TW | 200950081 | | 12/2009 |

OTHER PUBLICATIONS

Office Action in TW Application No. 102125378, mailed Apr. 23, 2015, 8 pages.

* cited by examiner

SEMICONDUCTOR DEVICE AND MANUFACTURING METHOD OF SEMICONDUCTOR DEVICE

CROSS-REFERENCE TO RELATED APPLICATION

This patent application is based upon and claims the benefit of priority of the prior Japanese Patent Application No. 2012-218244 filed on Sep. 28, 2012, the entire contents of which are incorporated herein by reference.

FIELD

The embodiments discussed herein are related to a semiconductor device and a manufacturing method of a semiconductor device.

BACKGROUND

GaN, AlN, InN, which are nitride semiconductors, or materials made of mixed crystals thereof, have a wide band gap, and are used as high output electronic devices or short-wavelength light emitting devices. Among these, as high output devices, technologies are developed in relation to Field effect transistors (FET), more particularly, High Electron Mobility Transistors (HEMT). A HEMT using such a nitride semiconductor is capable of realizing high current, high voltage, and low on resistance operations, and is thus used for high output/high efficiency amplifiers and high power switching devices.

As a HEMT using a nitride semiconductor, there is disclosed a HEMT formed by sequentially forming a GaN layer and an AlGaN layer on a substrate made of, for example, sapphire, SiC (silicon carbide), GaN (gallium nitride), or Si (silicon), and using the GaN layer as an electron transit layer. The band gap of the GaN forming this HEMT is 3.4 eV, which is wider than 1.4 eV of GaAs. Therefore, a HEMT using a GaN layer as an electron transit layer is capable of operating in high breakdown voltage. Accordingly, considerations are being made to apply this HEMT to a high breakdown voltage power source. However, a HEMT formed with GaN usually becomes normally-on, and is thus unsuitable for applying to a power source. Thus, to make the HEMT become normally-off, for example, there is disclosed an HEMT in which a p-GaN layer is formed immediately below the gate electrode.

Patent document 1: Japanese Laid-Open Patent Publication No. 2002-359256

Based on FIG. 1, a description is given of a HEMT having a structure in which a p-GaN layer is formed immediately below the gate electrode. In a HEMT having this structure, a buffer layer 921, a GaN electron transit layer 922, and an AlGaN electron supply layer 923 are laminated on a substrate 910. On the AlGaN electron supply layer 923, a source electrode 932 and a drain electrode 933 are formed. According to the formed GaN electron transit layer 922 and AlGaN electron supply layer 923, 2DEG (two dimensional gas) 922a is formed in the GaN electron transit layer 922, near the interface between the GaN electron transit layer 922 and the AlGaN electron supply layer 923. Furthermore, in the area immediately below a gate electrode 931 on the AlGaN electron supply layer 923, there is formed a p-GaN layer 924, and the gate electrode 931 is formed on the p-GaN layer 924. Therefore, as the p-GaN layer 924 is formed immediately below the gate electrode 931, the 2DEG 922a disappears immediately below the p-GaN layer 924, i.e., immediately below the gate electrode 931, and therefore the HEMT becomes normally-off.

FIG. 2 illustrates results obtained by actually fabricating the HEMT having the structure illustrated in FIG. 1, and measuring the relationship between the gate voltage and the drain current. As illustrated in FIG. 2, in the HEMT having the structure illustrated in FIG. 1, when a gate voltage is applied, variations arise in the flowing drain current, and a hump is generated, so that there are cases where a drain current of approximately $1 \times 10^{-6}$ A/mm through $1 \times 10^{-7}$ A/mm flows even when a gate voltage is not applied. As described above, when a variation arises in the drain current in each element, a variation also arises in the on resistance. Therefore, when a HEMT having this structure is used as a power source, the properties of the power source become non-uniform. Furthermore, when a hump is generated, as described above, there are cases where a drain current flows even when a gate voltage is not applied. Therefore, the HEMT does not become completely normally-off, and there are cases where the HEMT breaks due to heat. Note that FIG. 2 indicates the properties of three HEMTs fabricated by the same process, and that that the applied drain voltage Vd is 1 V.

SUMMARY

According to an aspect of the embodiments, a semiconductor device includes a first semiconductor layer formed on a substrate; a second semiconductor layer and a third semiconductor layer formed on the first semiconductor layer; a fourth semiconductor layer formed on the third semiconductor layer; a gate electrode formed on the fourth semiconductor layer; and a source electrode and a drain electrode formed in contact with the second semiconductor layer, wherein the third semiconductor layer and the fourth semiconductor layer are formed in an area immediately below the gate electrode, the fourth semiconductor layer is formed with a p-type semiconductor material, and the second semiconductor layer and the third semiconductor layer are formed with AlGaN, and the third semiconductor layer has a lower composition ratio of Al than that of the second semiconductor layer.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

Figure 1:
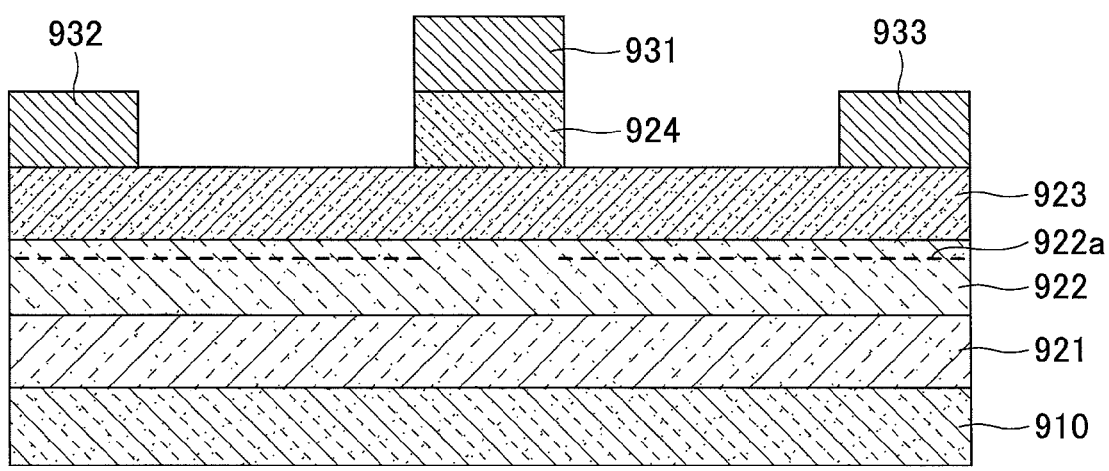
FIG. 1 illustrates a structure of a conventional semiconductor device in which p-GaN is formed.

Preferred embodiments of the present invention will be explained with reference to accompanying drawings. In the following, the same members are denoted by the same reference numerals and are not further described.

First Embodiment

Figure 2:
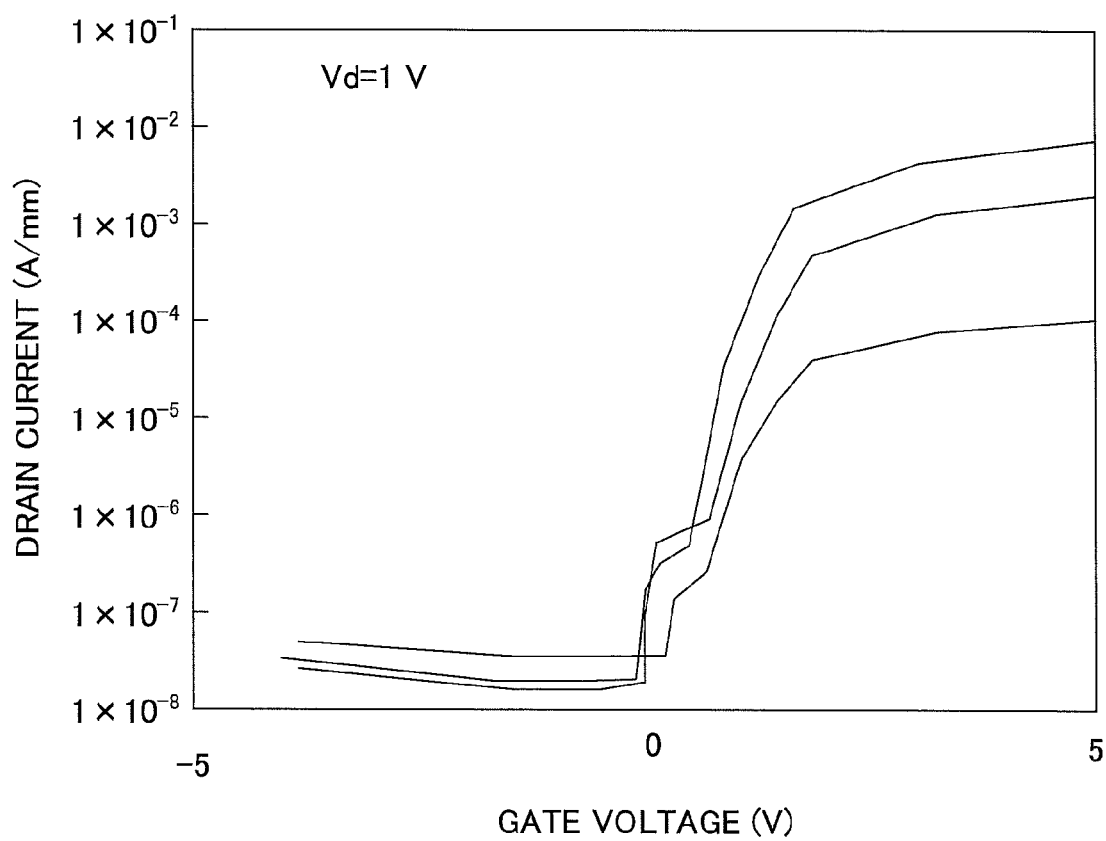
FIG. 2 is a property diagram of the drain current in a conventional semiconductor device.

A description is given of the reason why variations in the drain current increase and why a hump is generated as indicated in FIG. 2, in the HEMT having the structure illustrated in FIG. 1.

Figure 3:
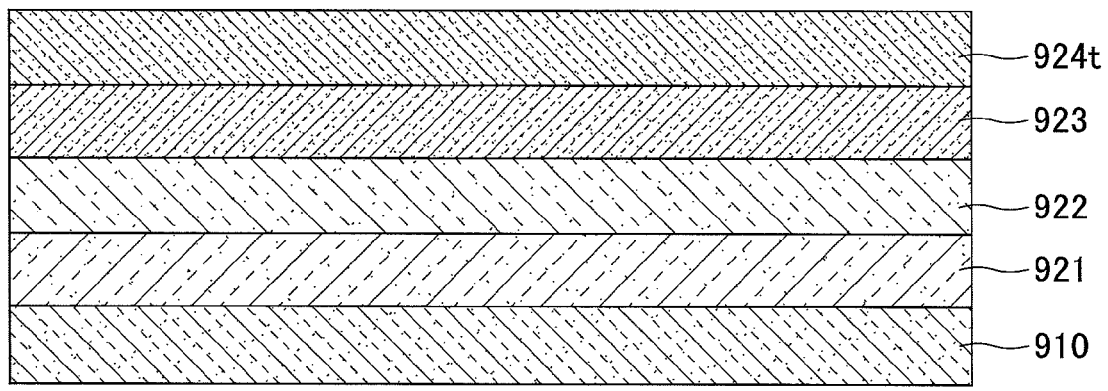
FIG. 3 illustrates a method of manufacturing a conventional semiconductor device.
Figure 4A:
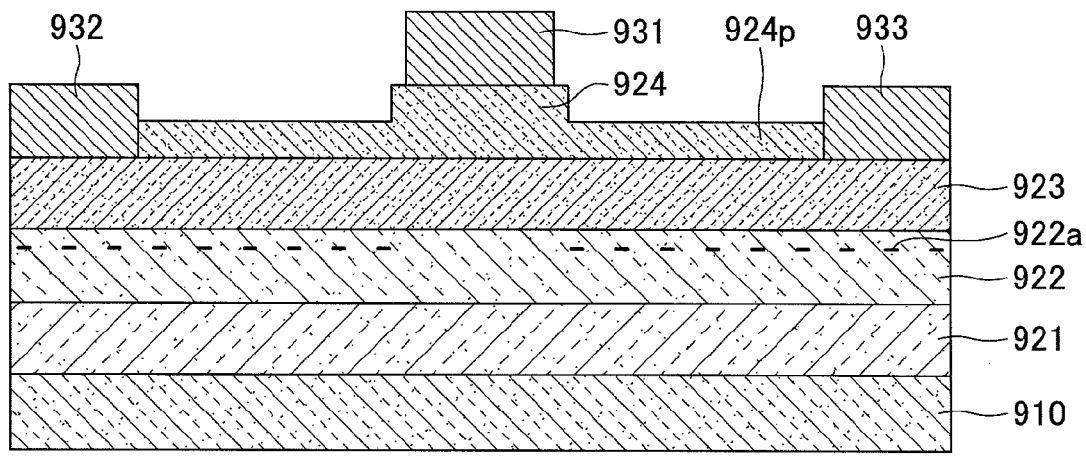
FIGS. 4A and 4B illustrate a structure of a conventional semiconductor device that is actually fabricated.
Figure 4B:
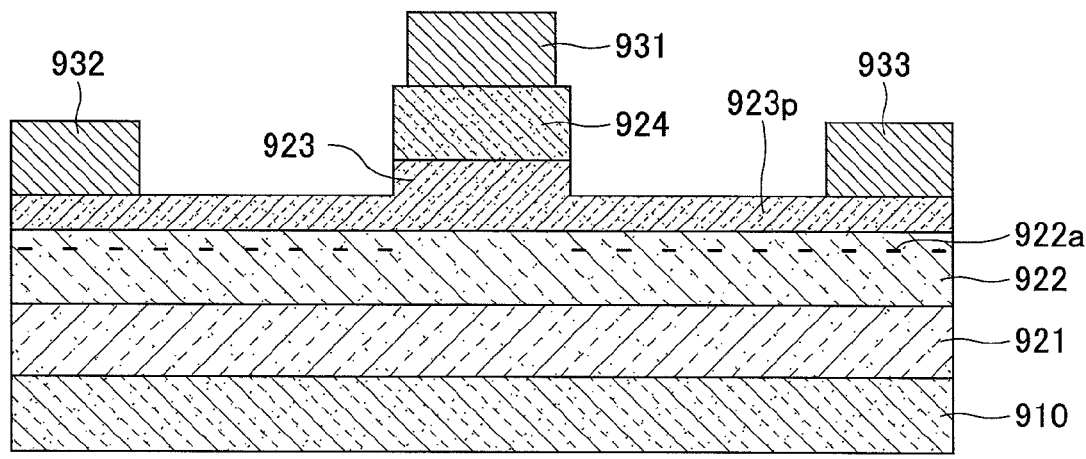

First, a description is given of the reason why variations in the drain current increase. In the manufacturing process of the HEMT having the structure illustrated in FIG. 1, first, as illustrated in FIG. 3, the buffer layer 921, the GaN electron transit layer 922, the AlGaN electron supply layer 923, and a p-GaN film 924t are laminated on the substrate 910. Then, the p-GaN film 924t is removed excluding the area where the gate electrode 931 is to be formed, and the p-GaN layer 924 is formed. In this case, it is significantly difficult to remove the p-GaN film 924t only from the area where the gate electrode 931 is not formed. Therefore, in the HEMT to be formed, as illustrated in FIG. 4A, there are cases where a p-GaN film 924p remains in areas other than the area where the gate electrode 931 is to be formed. Furthermore, as illustrated in FIG. 4B, there are cases where a part of the AlGaN electron supply layer 923 is removed.

As illustrated in FIG. 4A, when the p-GaN film 924p remains between the gate electrode 931, the source electrode 932, and the drain electrode 933, the density of the 2DEG 922a decreases due to the remaining p-GaN film 924p. Accordingly, the drain current decreases and the on resistance increases. Furthermore, as illustrated in FIG. 4B, when a part of the AlGaN electron supply layer 923 is removed due to over etching in areas excluding the area where the gate electrode 931 is to be formed, the thickness of a AlGaN electron supply layer 923p in this area is reduced. When the AlGaN electron supply layer 923p becomes thin, the density of the 2DEG 922a decreases, and similarly, the drain current decreases and the on resistance increases.

As described above, the drain current is dependent on the thickness of the remaining p-GaN film 924p and the over etching amount of the AlGaN electron supply layer 923. Therefore, the variation in the drain current is considered to be caused by the non-uniform etching. However, as described above, with the present technology, it is significantly difficult to remove the p-GaN film 924t only from the area where the gate electrode 931 is not formed.

Figure 5:
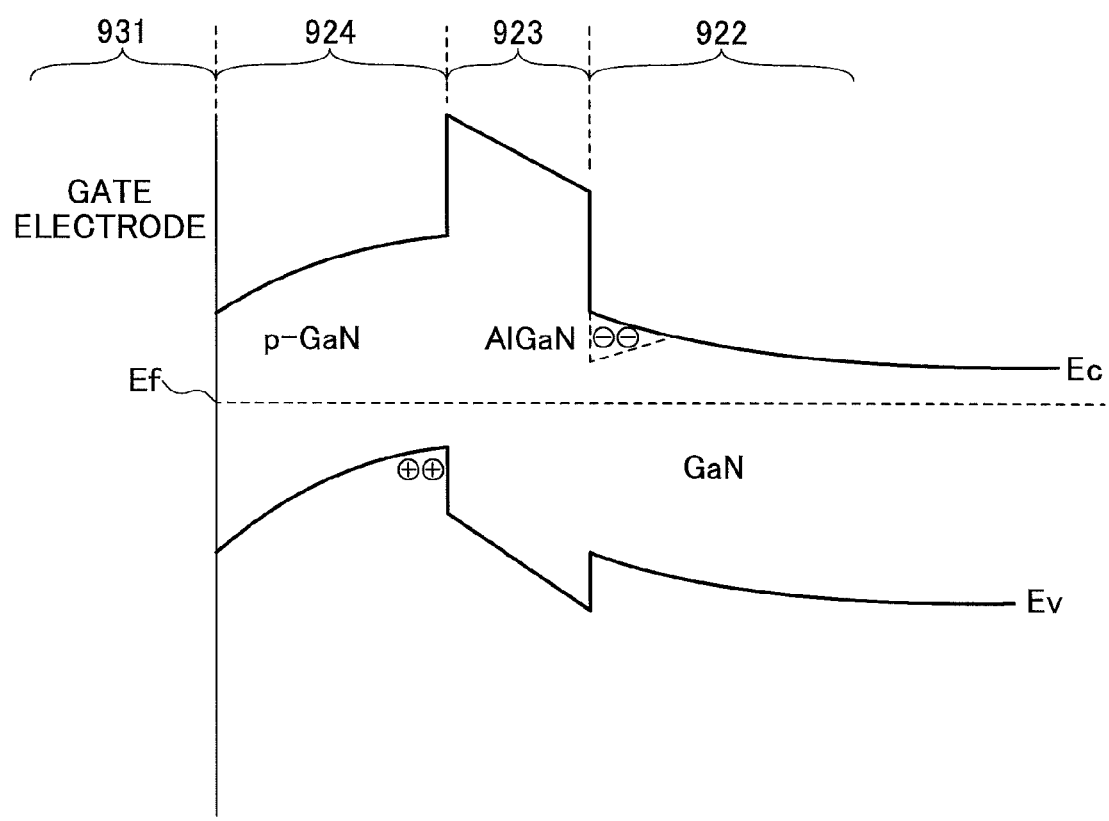
FIG. 5 is an energy band diagram of a conventional semiconductor device.
Figure 6:
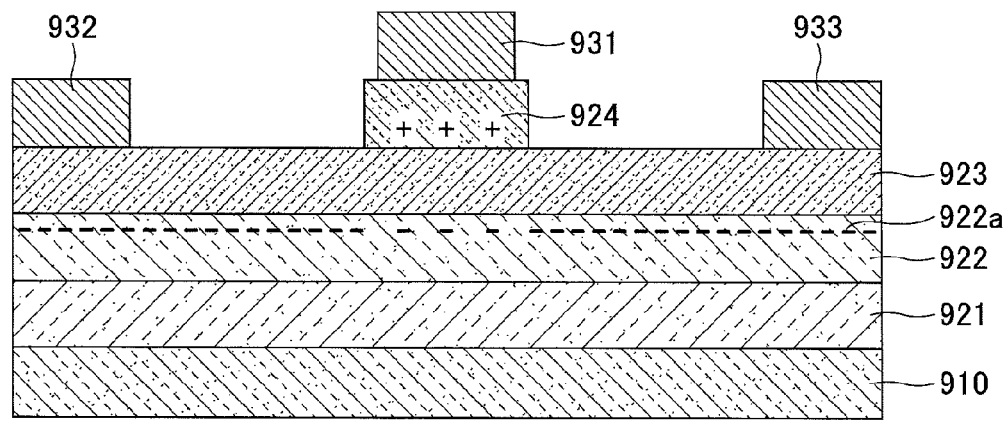
FIG. 6 describes a conventional semiconductor device.

Next, a description is given on the reason why a hump is generated. FIG. 5 is an energy band diagram of HEMT having the structure illustrated in FIG. 1. In the HEMT having the structure illustrated in FIG. 1, when the p-GaN layer 924 is thick, and a voltage is repeatedly applied to the gate electrode 931, even if a gate voltage is not applied, there are cases where holes are accumulated in the p-GaN layer 924 near the interface between the p-GaN layer 924 and the AlGaN electron supply layer 923. When the thickness of the AlGaN electron supply layer 923 is set to be greater than or equal to 20 nm and the Al composition is set to be greater than or equal to 15% in order to reduce the on resistance, in order to make the HEMT become normally-off, the thickness of the p-GaN layer 924 is to be greater than or equal to 60 nm. In this case, holes tend to be accumulated. When holes are accumulated in the p-GaN layer 924 near the interface between the p-GaN layer 924 and the AlGaN electron supply layer 923, electrons are induced in the GaN electron transit layer 922 near the interface between the GaN electron transit layer 922 and the AlGaN electron supply layer 923. When electrons are induced in the GaN electron transit layer 922, a drain current flows even when the gate voltage is 0V. This is not a normally-off operation, and is not preferable. FIG. 6 illustrates a state where holes have accumulated in the p-GaN layer 924, and electrons have been induced in the GaN electron transit layer 922 near the interface between the GaN electron transit layer 922 and the AlGaN electron supply layer 923 due to the holes. Note that in order to prevent holes from accumulating in the p-GaN layer 924, the thickness of the p-GaN layer 924 is to be reduced. In this case, the threshold voltage becomes negative, and therefore the HEMT does not become normally-off. Thus, the thickness of the p-GaN layer 924 is preferably not reduced in view of attaining normally-off. Accordingly, in a state where the AlGaN electron supply layer 923 has a low on resistance, it is significantly difficult to control the thickness of the p-GaN layer 924 to be thin so as not to generate a hump.

Semiconductor Device

Figure 7:
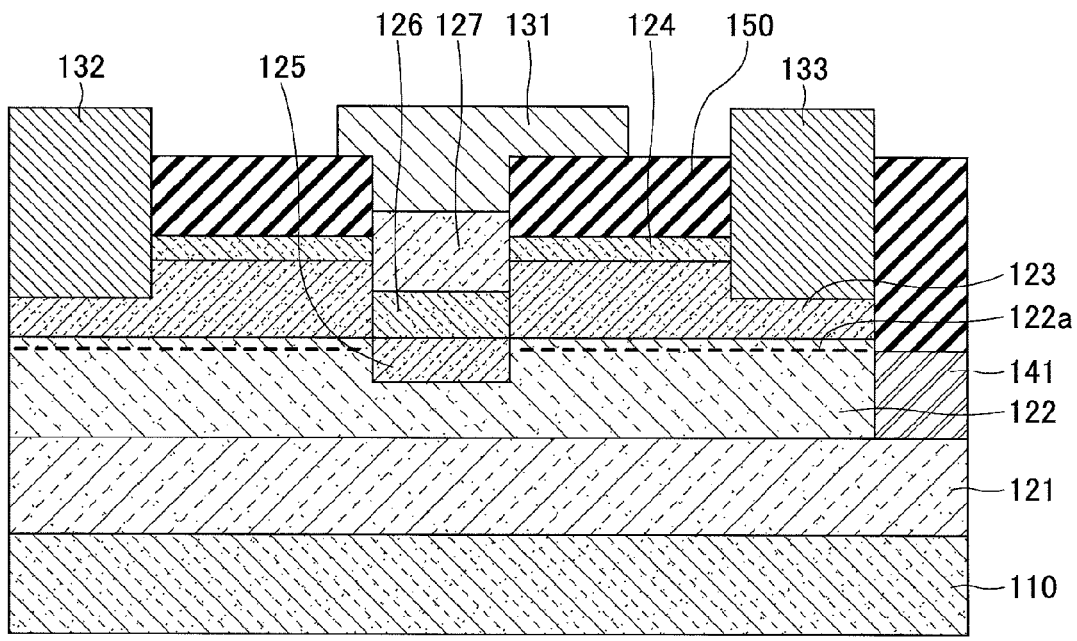
FIG. 7 illustrates a structure of a semiconductor device according to a first embodiment.

Next, a description is given of a semiconductor device according to the present embodiment. As illustrated in FIG. 7, the semiconductor device according to the present embodiment includes a buffer layer 121, an electron transit layer 122, an electron supply layer 123, and a cap layer 124, which are laminated by epitaxial growth on a substrate 110. Furthermore, in an area immediately below a gate electrode 131, parts of the cap layer 124, the electron supply layer 123, and the electron transit layer 122 are removed. In this area from which the parts are removed, a regrowth electron transit layer 125, a regrowth electron supply layer 126, and a p-GAN layer 127 are formed. On the p-GAN layer 127, the gate electrode 131 is formed, and on the electron supply layer 123, a source electrode 132 and a drain electrode 133 are formed. On the electron transit layer 122, an element separation area 141 is formed by injecting Ar, etc. On the cap layer 124 and the element separation area 141, a protection film 150 is formed with SiN, etc. In the present embodiment, the electron transit layer 122 may be described as a first semiconductor layer, the electron supply layer 123 may be described as a second semiconductor layer, the regrowth electron supply layer 126 may be described as a third semiconductor layer, and the p-GAN layer 127 may be described as a fourth semiconductor layer. Furthermore, the regrowth electron transit layer 125 may be described as a fifth semiconductor layer.

In the present embodiment, the substrate 110 is formed with a semiconductor material such as silicon and SiC, and the buffer layer 121 is formed with i-AlGaN. The electron transit layer 122 is formed with i-GaN, and the electron supply layer 123 is formed with $Al_{0.2}Ga_{0.8}N$ having a thickness of approximately 20 nm. Accordingly, in the electron transit layer 122, 2DEG 122a is formed in the electron transit layer 122 near the interface between the electron transit layer 122 and the electron supply layer 123. The electron supply layer 123 is preferably formed such that $0.15 \leq x \leq 0.3$ is satisfied when described as $Al_xGa_{1-x}N$.

Furthermore, the regrowth electron transit layer 125 is formed with GaN, and the regrowth electron supply layer 126 is formed with $Al_{0.15}Ga_{0.85}N$ having a thickness of 10 nm. The regrowth electron supply layer 126 is formed with a material having a lower composition ratio of Al than that of the electron supply layer 123. The regrowth electron supply layer 126 is preferably formed to satisfy $0 \leq y \leq 0.2$, more preferably $0.1 \leq y \leq 0.2$, when described as $Al_yGa_{1-y}N$. As described above, by forming the regrowth electron supply layer 126 with a material having a lower composition ratio of Al than that of the electron supply layer 123, the density of the 2DEG 122a in the area where the regrowth electron supply layer 126 is reduced, and the HEMT tends to become normally-off. That is to say, by forming the regrowth electron supply layer 126 with a material having a lower composition ratio of Al than that of the electron supply layer 123, normally-off is realized even if the p-GAN layer 127 is thin. In this case, as the thickness of the p-GAN layer 127 is less than 60 nm, holes do not accumulate between the p-GAN layer 127 and the regrowth electron supply layer 126 formed with AlGaN. Accordingly, a hump is prevented from being generated, and the HEMT tends to become normally-off.

Furthermore, the thickness of the regrowth electron supply layer 126 is less than or equal to the thickness of the electron supply layer 123, more preferably thinner than the electron supply layer 123. Furthermore, the regrowth electron supply layer 126 preferably has a thickness that is greater than or equal to 8 nm and less than or equal to 12 nm. Furthermore, the interface between the regrowth electron transit layer 125 and the regrowth electron supply layer 126 is preferably formed so as to have substantially the same height as the interface between the electron transit layer 122 and the electron supply layer 123, although a substantially same height may vary to some extent.

Furthermore, the p-GAN layer 127 is formed with p-GaN having a thickness of 50 nm, and Mg is doped as a p-type impurity element. The cap layer 124 is formed with n-GaN having a thickness of 5 nm. The gate electrode 131 is in Schottky contact with the p-GAN layer 127, and the source electrode 132 and the drain electrode 133 are in ohmic contact with the electron supply layer 123.

In the present embodiment, immediately below the gate electrode 131, the regrowth electron supply layer 126, which has a lower composition ratio of Al than that of the electron supply layer 123, is formed to have a thickness that is less than or equal to the electron supply layer 123. Furthermore, between the regrowth electron supply layer 126 and the gate electrode 131, the p-GAN layer 127 is formed. Accordingly, the 2DEG 122a is made to disappear immediately below the gate electrode 131. Thus, in the gate electrode 131, it is possible to reduce the drain current flowing in a state where the gate voltage is not applied, so that the HEMT becomes normally-off even more reliably. Furthermore, the regrowth electron supply layer 126 and the p-GAN layer 127 are formed to have a substantially uniform thickness immediately below the gate electrode 131, and therefore it is also possible to reduce the variation in the drain current flowing in a case where a gate voltage is applied to the gate electrode 131.

Manufacturing Method of Semiconductor Device

Next, a description is given of a method of manufacturing the semiconductor device according to the present embodiment.

Figure 8A:
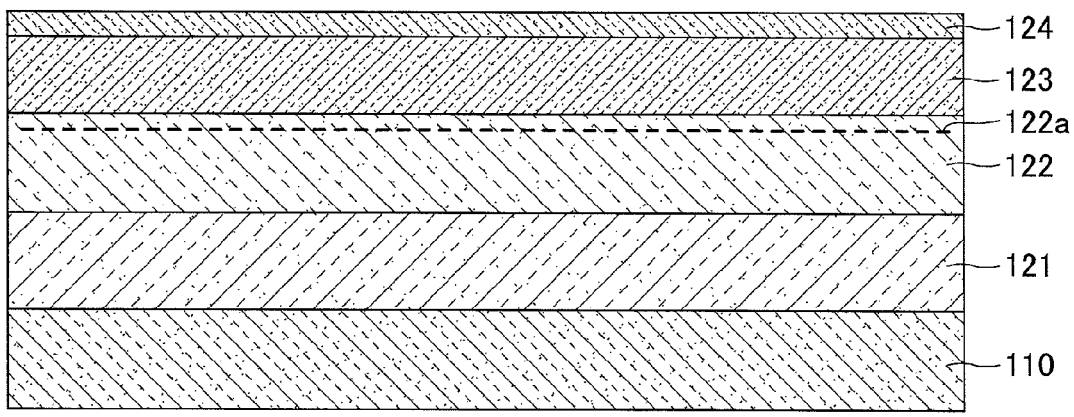
FIGS. 8A and 8B illustrate procedures of a method of manufacturing the semiconductor device according to the first embodiment (1)

First, as illustrated in FIG. 8A, on the substrate 110, the buffer layer 121, the electron transit layer 122, the electron supply layer 123, and the cap layer 124 are formed by MOVPE (Metal-Organic Vapor Phase Epitaxy). The substrate 110 is formed with, for example, SiC, and the buffer layer 121 is formed with i-AlGaN. The electron transit layer 122 is formed with i-GaN. The electron supply layer 123 is formed with $Al_{0.2}Ga_{0.8}N$ having a thickness of approximately 20 nm, and as an n-type impurity element, Si is doped by a density of $1 \times 10^{18}$ cm$^{-3}$. The cap layer 124 is formed with GaN having a thickness of approximately 5 nm, and as an n-type impurity element, Si is doped by a density of $1 \times 10^{18}$ cm$^{-3}$. Accordingly, in the electron transit layer 122, the 2DEG 122a is formed near the interface between the electron transit layer 122 and the electron supply layer 123.

When forming the above nitride semiconductor layer by MOVPE, aluminum trimethyl (TMAl) as a raw material of aluminum (Al), trimethyl gallium (TMGa) as a raw material of gallium (Ga), and ammonia (NH$_3$) as a raw material of nitrogen (N), are used. Silane as a raw material of Si that is an n-type impurity element, and Cp2Mg as a raw material of Mg that is a p-type impurity element are used.

Figure 8B:
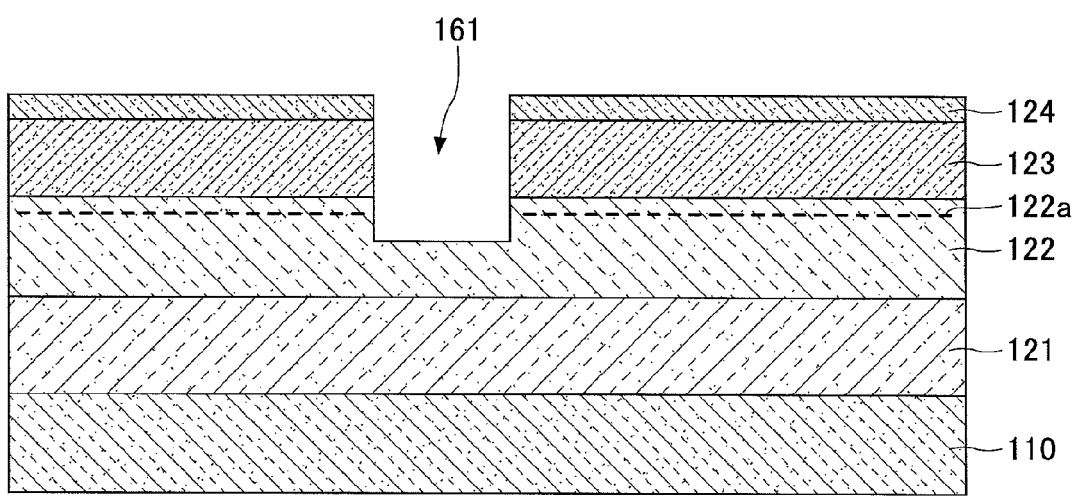

Next, as illustrated in FIG. 8B, immediately below the area where the gate electrode 131 described below is to be formed, parts of the cap layer 124, the electron supply layer 123, the electron transit layer 122 are removed to form an opening part 161. Specifically, photoresist is applied on the surface of the cap layer 124, and exposing and developing are performed with an exposing device to form a resist pattern (not illustrated) having an opening in the area where the opening part 161 is to be formed. Subsequently, dry etching such as RIE (Reactive Ion Etching) is performed to remove parts of the cap layer 124, the electron supply layer 123, and the electron transit layer 122 in the area where the resist pattern is not formed, so that the opening part 161 is formed. For the dry etching performed at this time, chlorine (Cl$_2$) is used as the etching gas. The resist pattern (not illustrated) is subsequently removed with an organic solvent.

Figure 9A:
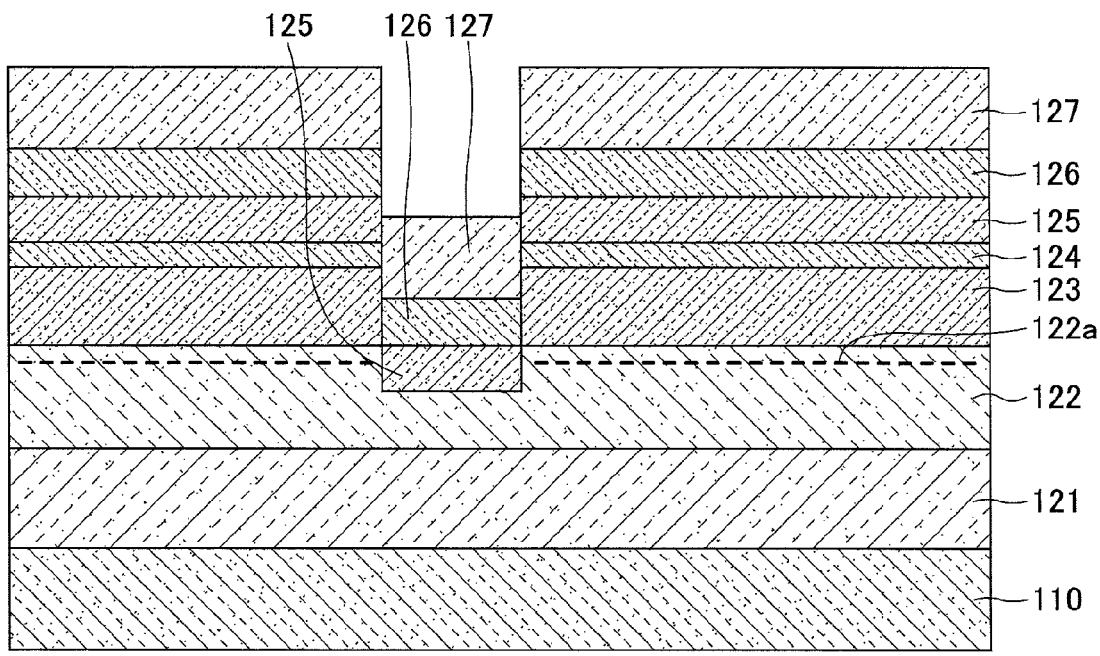
FIGS. 9A and 9B illustrate procedures of a method of manufacturing the semiconductor device according to the first embodiment (2)

Next, as illustrated in FIG. 9A, on the surface where the opening part 161 is formed, the regrowth electron transit layer 125, the regrowth electron supply layer 126, and the p-GAN layer 127 are formed by MOVPE. The regrowth electron transit layer 125 is formed by GaN, and the height of the regrowth electron transit layer 125 is formed so as to substantially match the height of the interface between the electron transit layer 122 and the electron supply layer 123. The regrowth electron supply layer 126 is formed with $Al_{0.25}Ga_{0.85}N$ having a thickness of approximately 10 nm, and as an n-type impurity element, Si is doped at a density of $1 \times 10^{18}$ cm$^{-3}$. The p-GAN layer 127 is formed with p-GaN having a thickness of approximately 50 nm, and as a p-type impurity element, Mg is doped at a density of $4 \times 10^{19}$ cm$^{-3}$.

Figure 9B:
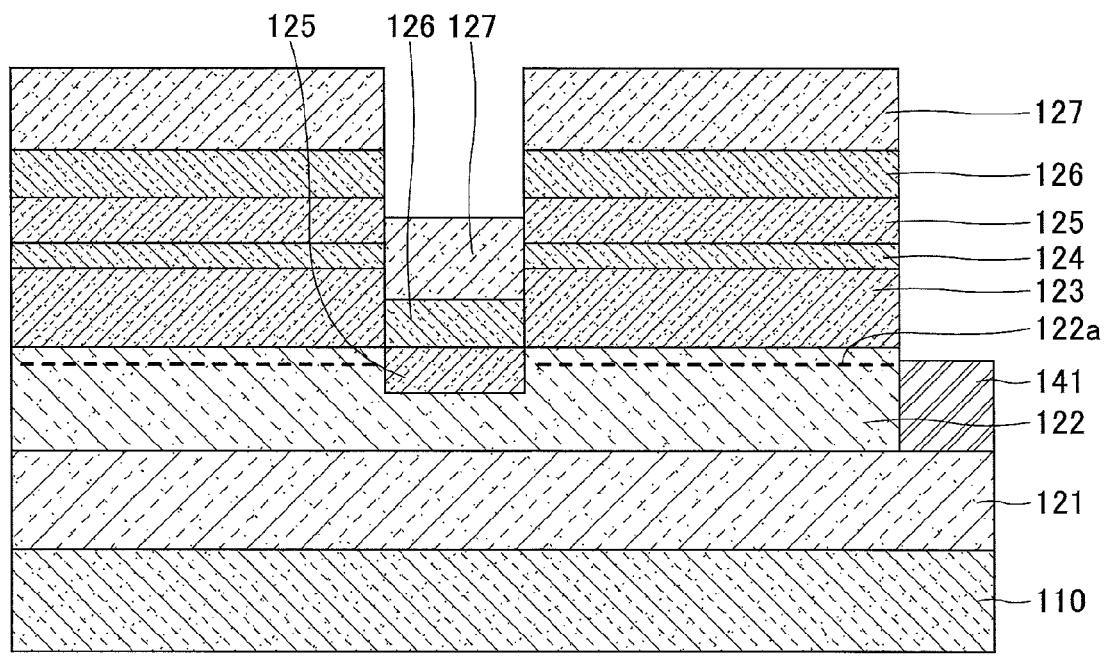

Next, as illustrated in FIG. 9B, the element separation area 141 for separating elements is formed. Specifically, photoresist is applied on the p-GAN layer 127, and exposing and developing are performed with an exposing device, to form a resist pattern having an opening in the area where the element separation area 141 is to be formed. Subsequently, by dry etching, parts of the p-GAN layer 127, the regrowth electron supply layer 126, the regrowth electron transit layer 125, the cap layer 124, the electron supply layer 123, and the electron transit layer 122 are removed in the area where the resist pattern is not formed, to form an element separation recess.

Subsequently, an accelerating voltage of 10 keV is applied and Ar of a dose amount of $1\times10^{14}$ cm$^{-2}$ is injected, to form the element separation area 141. Note that the resist pattern (not illustrated) is subsequently removed with an organic solvent.

Figure 10A:
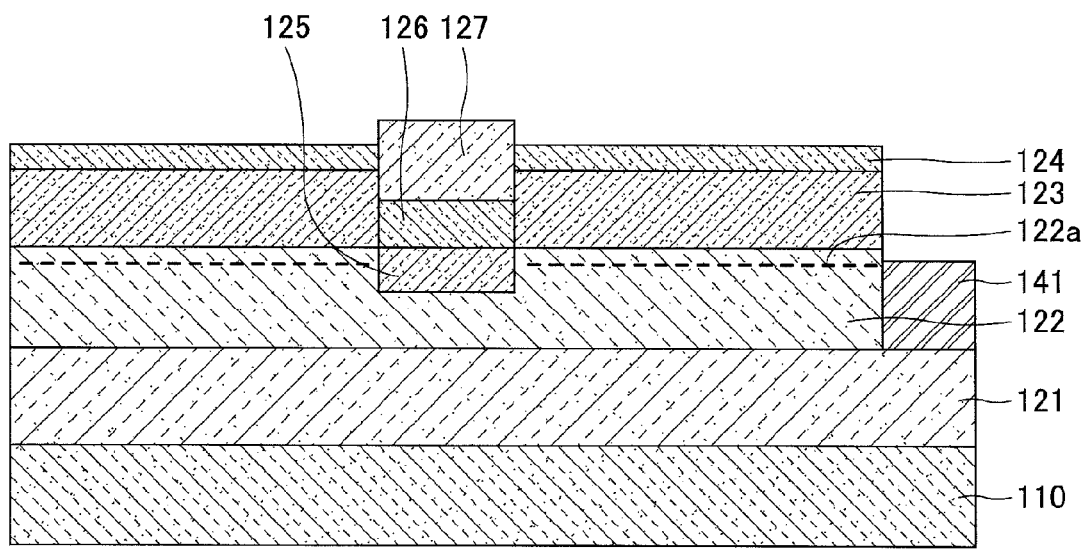
FIGS. 10A and 10B illustrate procedures of a method of manufacturing the semiconductor device according to the first embodiment (3)

Next, as illustrated in FIG. 10A, the p-GAN layer 127 is removed from areas excluding the area where the gate electrode 131 is to be formed. Specifically, on the p-GAN layer 127, photoresist is applied, and exposing and developing is performed with an exposing device to form a resist pattern (not illustrated) in the area where the gate electrode 131 is to be formed. Subsequently, by performing dry etching such as RIE, the p-GAN layer 127, the regrowth electron supply layer 126, and the regrowth electron transit layer 125 are removed from the area where the resist pattern is not formed. Accordingly, the surface of the cap layer 124 is exposed. For the dry etching performed at this time, chlorine is used as the etching gas. In this procedure, there are cases where the regrowth electron transit layer 125 remains in the areas excluding the area where the gate electrode 131 is to be formed. However, if the p-GAN layer 127 is removed, even if the regrowth electron transit layer 125 remains, this does not affect the properties of the HEMT that is fabricated. Accordingly, the p-GAN layer 127 is formed in the area where the gate electrode 131 is to be formed. The resist pattern (not illustrated) is subsequently removed with an organic solvent.

Figure 10B:
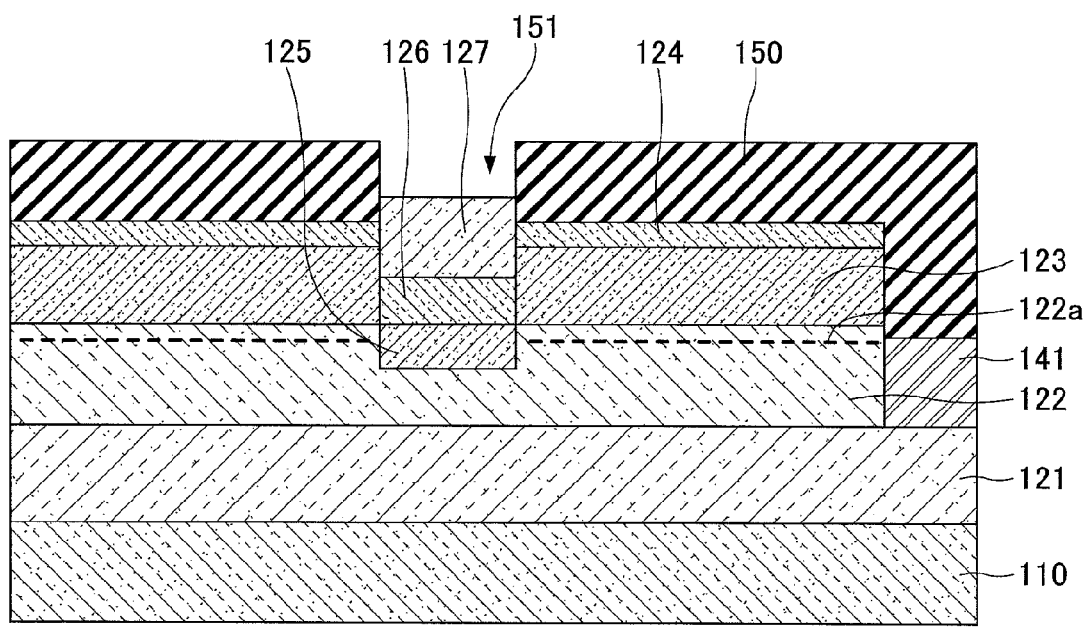

Next, as illustrated in FIG. 10B, the protection film 150 having an opening part 151 is formed in the area where the gate electrode 131 is to be formed. Specifically, on the cap layer 124 and the p-GAN layer 127, the protection film 150 made of SiN having a thickness of approximately 100 nm is formed by plasma CVD (Chemical Vapor Deposition). Subsequently, on the formed protection film 150, photoresist is applied, and by performing exposing and developing with an exposing device, a resist pattern (not illustrated) having an opening is formed in the area where the gate electrode 131 is to be formed. Subsequently, by performing dry etching such as RIE using SF$_6$ as etching gas, the protection film 150 made of SiN is removed from the area where the resist pattern is not formed. Accordingly, in the area where the gate electrode 131 is to be formed, the opening part 151 is formed in the protection film 150, and the surface of the p-GAN layer 127 is exposed. The resist pattern (not illustrated) is subsequently removed with an organic solvent.

Figure 11A:
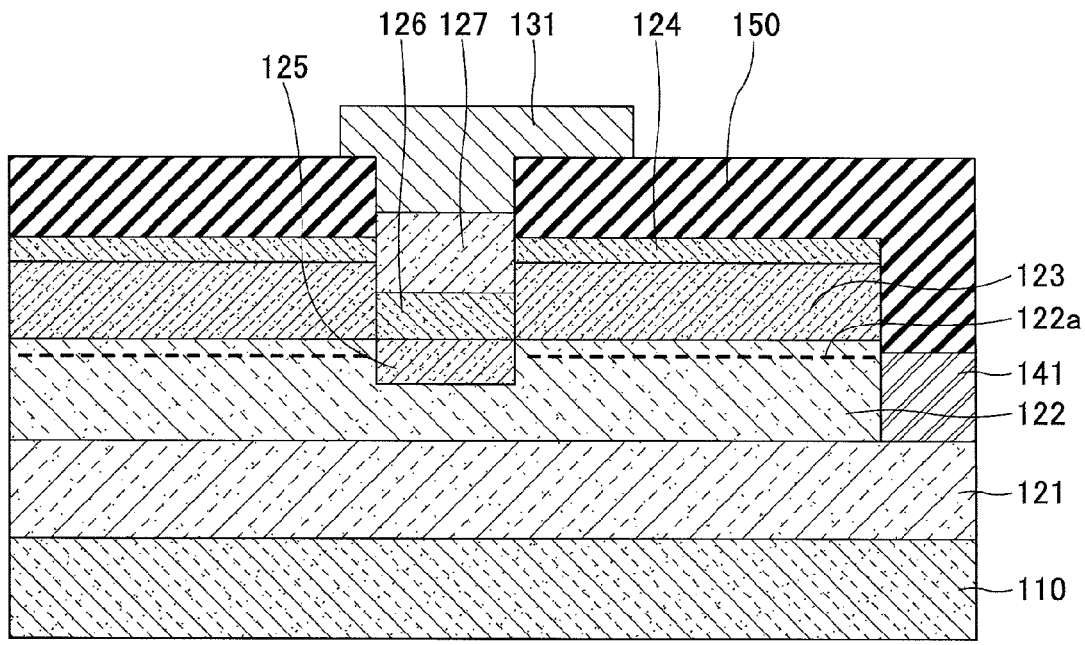
FIGS. 11A and 11B illustrate procedures of a method of manufacturing the semiconductor device according to the first embodiment (4)

Next, as illustrated in FIG. 11A, the gate electrode 131 is formed. Specifically, on the p-GAN layer 127 and the protection film 150, photoresist is applied, and exposing and developing are performed with an exposing device, to form a resist pattern having an opening in the area where the gate electrode 131 is to be formed. Subsequently, by vacuum vapor deposition, a metal multilayer film is formed, including a Ni (nickel) film having a thickness of approximately 30 nm and an Au (gold) film having a thickness of approximately 400 nm. Subsequently, by immersing this in an organic solvent, the metal multilayer film formed on the resist pattern is lifted off together with the resist pattern and removed, so that the gate electrode 131 is formed by the remaining metal multilayer film. The gate electrode 131 is formed in contact with the p-GAN layer 127 and is in Schottky contact with the p-GAN layer 127. The gate electrode 131 has a length in the direction from the source electrode 132 to the drain electrode 133, i.e., a gate length of approximately 0.5 µm. Furthermore, the gate electrode 131 has a length in the direction orthogonal to the gate length, i.e., a unit gate width of approximately 400 µm.

Figure 11B:
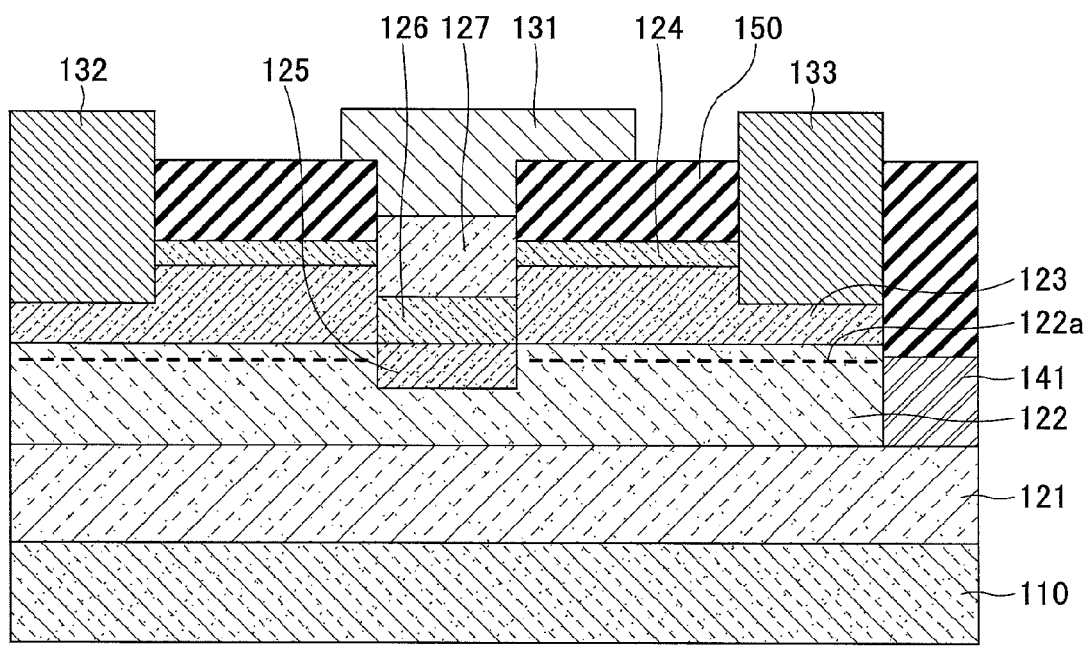

Next, as illustrated in FIG. 11B, the source electrode 132 and the drain electrode 133 are formed. Specifically, photoresist is applied on the protection film 150, and exposing and developing are performed with an exposing device, to form a resist pattern (not illustrated) having an opening in the area where the source electrode 132 and the drain electrode 133 are to be formed. Subsequently, parts of the protection film 150, the cap layer 124, and the electron supply layer 123 where the resist pattern is not formed are removed by dry etching such as RIE, to form the opening part. Accordingly, in the area where the source electrode 132 and the drain electrode 133 are to be formed, the electron supply layer 123 is exposed. For the dry etching performed for removing the SiN that is the protection film 150, SF$_6$ is used as the etching gas. Subsequently, by removing the resist pattern with an organic solvent, photoresist is applied again on the protection film 150, and exposing and developing are performed with an exposing device to form a resist pattern having an opening in the area where the source electrode 132 and the drain electrode 133 are to be formed. Subsequently, by vacuum vapor deposition, a metal multilayer film is formed, including a Ta (tantalum) film having a thickness of approximately 30 nm and an Al (aluminum) film having a thickness of approximately 200 nm. Subsequently, by immersing this in an organic solvent, the metal multilayer film formed on the resist pattern is lifted off together with the resist pattern and removed, so that the source electrode 132 and the drain electrode 133 are formed by the remaining metal multilayer film. After forming the source electrode 132 and the drain electrode 133 on the electron supply layer 123 as described above, heat treatment is performed at a temperature of 600° C., so that the source electrode 132 and the drain electrode 133 are made to be in ohmic contact with the electron supply layer 123 made of AlGaN.

By the above method, the semiconductor device according to the present embodiment is manufactured.

Figure 12:
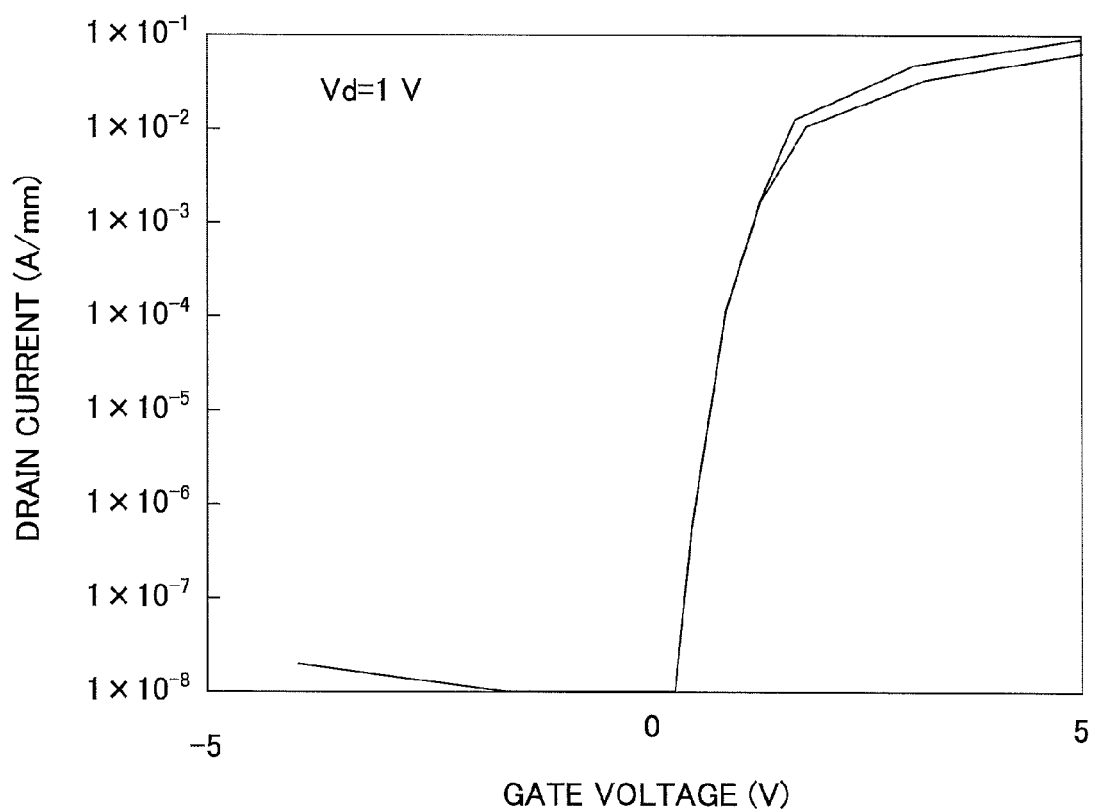
FIG. 12 is a property diagram of the drain current in the semiconductor device according to the first embodiment.

FIG. 12 illustrates the relationship between the gate voltage and the drain current of the HEMT that is the semiconductor device according to the present embodiment. As illustrated in FIG. 12, a hump is not generated in the HEMT according to the present embodiment, and therefore the drain current, which flows in a state where the gate voltage is not applied, is lower than that of the case illustrated in FIG. 2. Furthermore, the drain current is high, and also uniform. Accordingly, in the semiconductor device according to the present embodiment, the on resistance is low and the properties are uniform. FIG. 12 illustrates the properties of two semiconductor devices according to the present embodiment fabricated by the same procedures, and the applied drain voltage is 1 V.

In the above description, the regrowth electron supply layer 126 is formed with AlGaN. However, the regrowth electron supply layer 126 may be formed with GaN. In this case, the 2DEG 122a is not generated between the regrowth electron transit layer 125 and the regrowth electron supply layer 126, and therefore although the on resistance becomes high, the HEMT becomes normally-off even more reliably.

Figure 13:
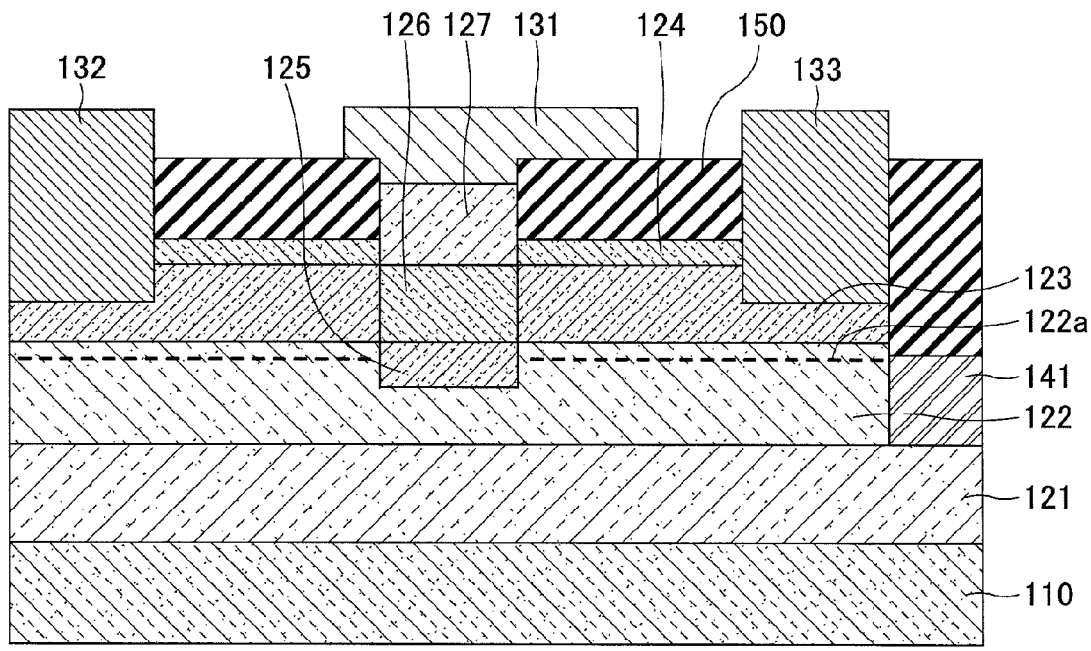
FIG. 13 illustrates a structure of another semiconductor device according to the first embodiment.

Furthermore, when the regrowth electron supply layer 126 has a lower composition ratio of aluminum than that of the electron supply layer 123, the same effects as the present embodiment are attained. Thus, as illustrated in FIG. 13, the regrowth electron supply layer 126 may be formed so as to have substantially the same thickness as the electron supply layer 123.

Second Embodiment

Figure 14:
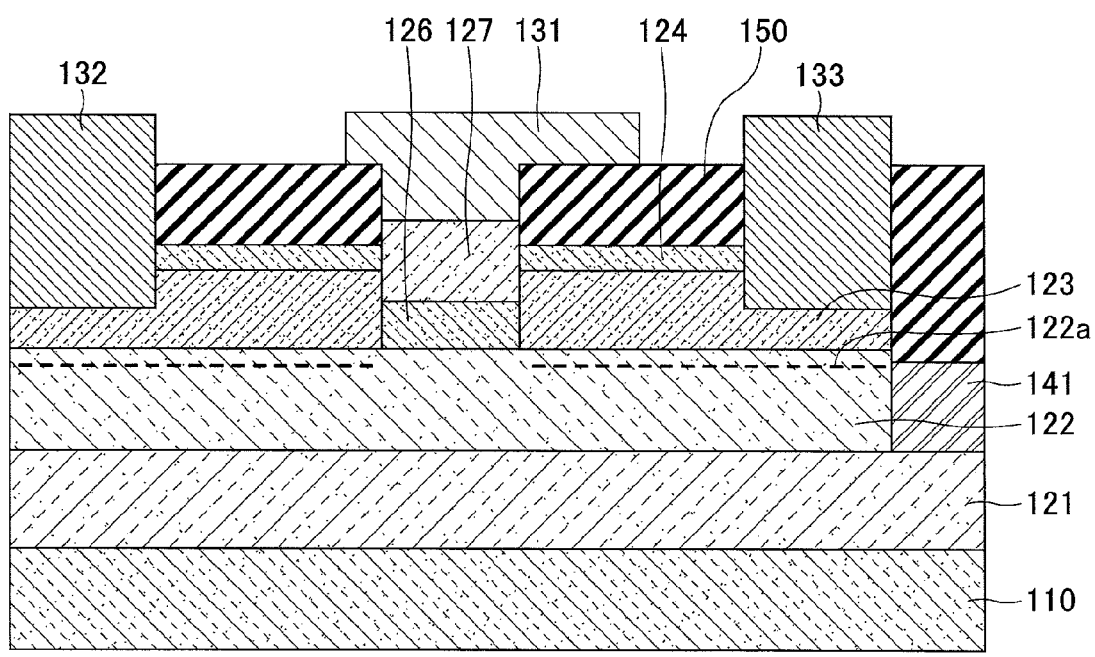
FIG. 14 illustrates a structure of a semiconductor device according to a second embodiment.

Next, a description is given of a semiconductor device according to a second embodiment. The semiconductor device according to the present embodiment has a structure in which the regrowth electron supply layer 126 is formed on the electron transit layer 122 without forming the regrowth electron transit layer 125 according to the first embodiment. In the first embodiment, consideration is made for a case where the etching surface is damaged due to etching by RIE, and a part of the electron transit layer 122 is removed by etching, and then the regrowth electron transit layer 125 and the regrowth electron supply layer 126 are formed. However, when the amount of damage due to etching the electron transit layer 122, etc., is small, as illustrated in FIG. 14, the regrowth electron supply layer 126 may be formed on the electron transit layer 122 without removing the electron transit layer 122 by etching.

The semiconductor device according to the present embodiment is manufactured by the method of manufacturing the semiconductor device according to the first embodiment, except that the regrowth electron supply layer 126 is formed on the electron transit layer 122 without removing the electron transit layer 122 by etching. That is to say, in the procedure illustrated in FIG. 8B, the opening part 161 is formed by removing the cap layer 124 and the electron supply layer 123 without removing the electron transit layer 122. Subsequently, in the procedure illustrated in FIG. 9A, on the electron transit layer 122 at the opening part 161, the regrowth electron supply layer 126 and the p-GAN layer 127 are formed to fabricate the semiconductor device according to the present embodiment.

Other than the contents described above, the second embodiment is the same as the first embodiment.

Third Embodiment

Next, a description is given of a third embodiment. The present embodiment is relevant to a semiconductor device, a power unit, and a high-frequency amplifier.

Figure 15:
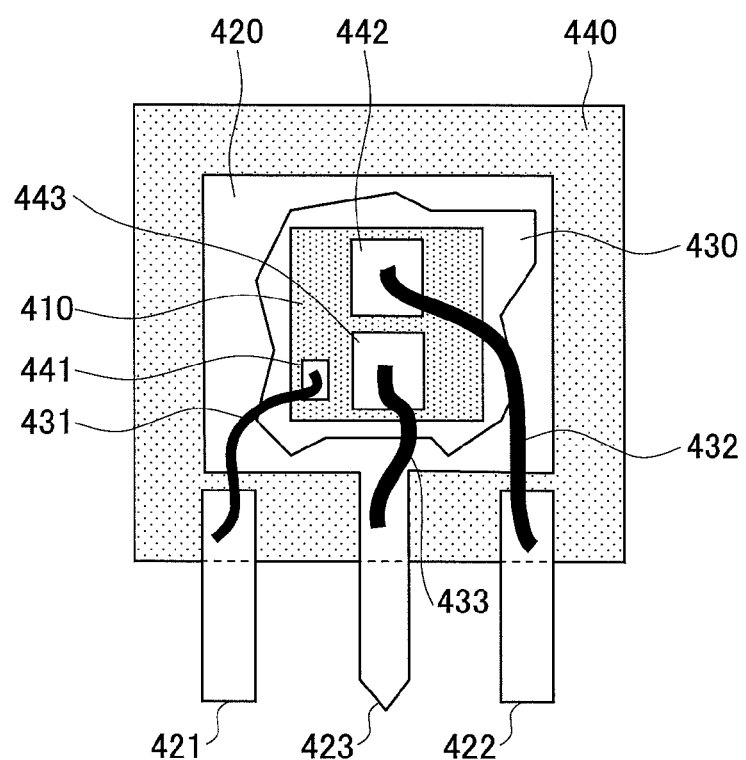
FIG. 15 illustrates a discretely packaged semiconductor device according to a third embodiment.

The semiconductor device according to the present embodiment is formed by discretely packaging the semiconductor device according to the first embodiment or the second embodiment. A description is given of this discretely packaged semiconductor device with reference to FIG. 15. FIG. 15 schematically illustrates the inside of the discretely packaged semiconductor device, and the locations of electrodes are different from those of the first embodiment or the second embodiment.

First, the semiconductor device manufactured according to the first embodiment or the second embodiment is cut by dicing, and a semiconductor chip 410 that is a HEMT made of a GaN system material is formed. The semiconductor chip 410 is fixed on a lead frame 420 by a diatouch agent 430 such as solder.

Next, the gate electrode 441 is connected to a gate lead 421 by a bonding wire 431, the source electrode 442 is connected to a source lead 422 by a bonding wire 432, and the drain electrode 443 is connected to a drain lead 423 by a bonding wire 433. The bonding wires 431, 432, and 433 are formed by a metal material such as Al. Furthermore, in the present embodiment, the gate electrode 441 is a gate electrode pad, which is connected to the gate electrode 131 of the semiconductor device according to the first embodiment or the second embodiment. Similarly, the source electrode 442 is a source electrode pad, which is connected to the source electrode 132. Furthermore, the drain electrode 443 is a drain electrode pad, which is connected to the drain electrode 133.

Next, resin sealing is performed with mold resin 440 by a transfer mold method. As described above, a discretely packaged semiconductor chip that is a HEMT made of a GaN system material is manufactured.

Furthermore, the power unit and the high-frequency amplifier according to the present embodiment use the semiconductor device according to the first embodiment or the second embodiment.

Figure 16:
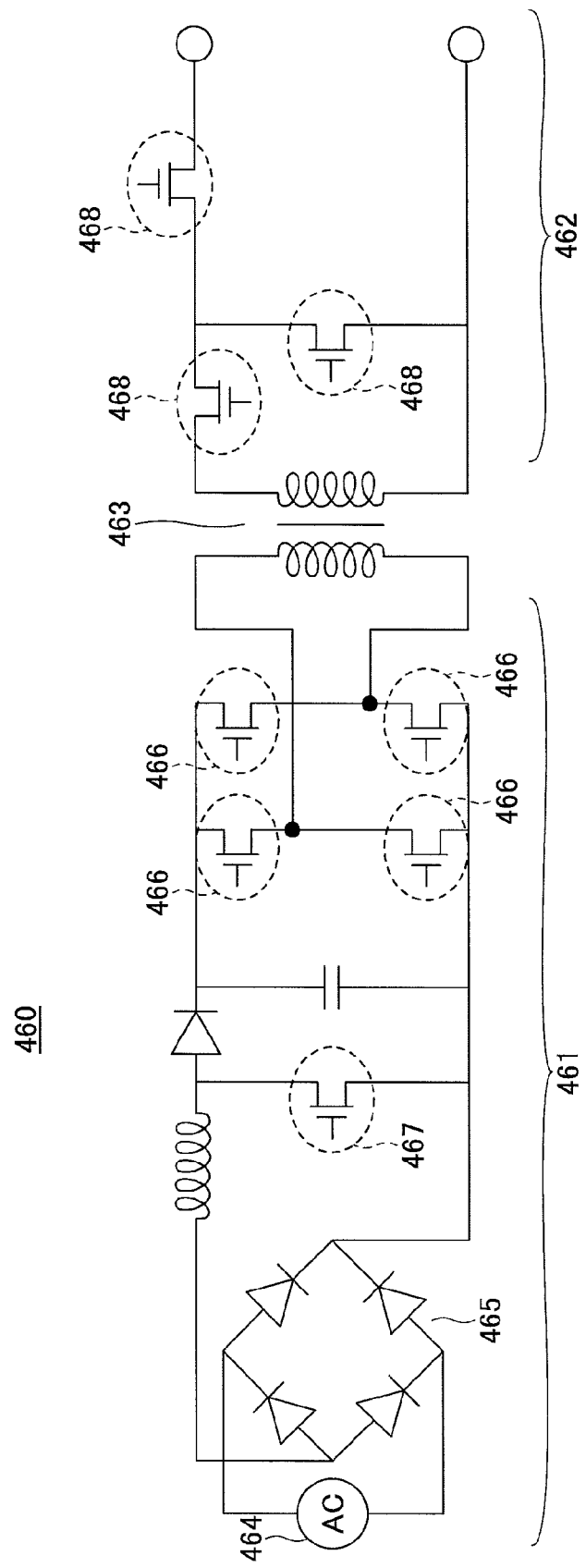
FIG. 16 is a circuit diagram of a power unit according to the third embodiment.

With reference to FIG. 16, a description is given of the power unit according to the present embodiment. A power unit 460 according to the present embodiment includes a high voltage primary side circuit 461, a low voltage secondary side circuit 462, and a transformer 463 disposed between the high voltage primary side circuit 461 and the low voltage secondary side circuit 462. The high voltage primary side circuit 461 includes an AC (alternating-current) source 464, a so-called bridge rectifier circuit 465, plural switching elements (four in the example of FIG. 16) 466, and one switching element 467. The low voltage secondary side circuit 462 includes plural switching elements 468 (three in the example of FIG. 16). In the example of FIG. 16, the semiconductor device according to the first embodiment or the second embodiment is used as the switching elements 466 and the switching element 467 of the high voltage primary side circuit 461. The switching elements 466 and 467 of the primary side circuit 461 are preferably normally-off semiconductor devices. Furthermore, switching elements 468 used in the low voltage secondary side circuit 462 are typical MISFET (Metal Insulator Semiconductor Field Effect Transistor) made of silicon.

Figure 17:
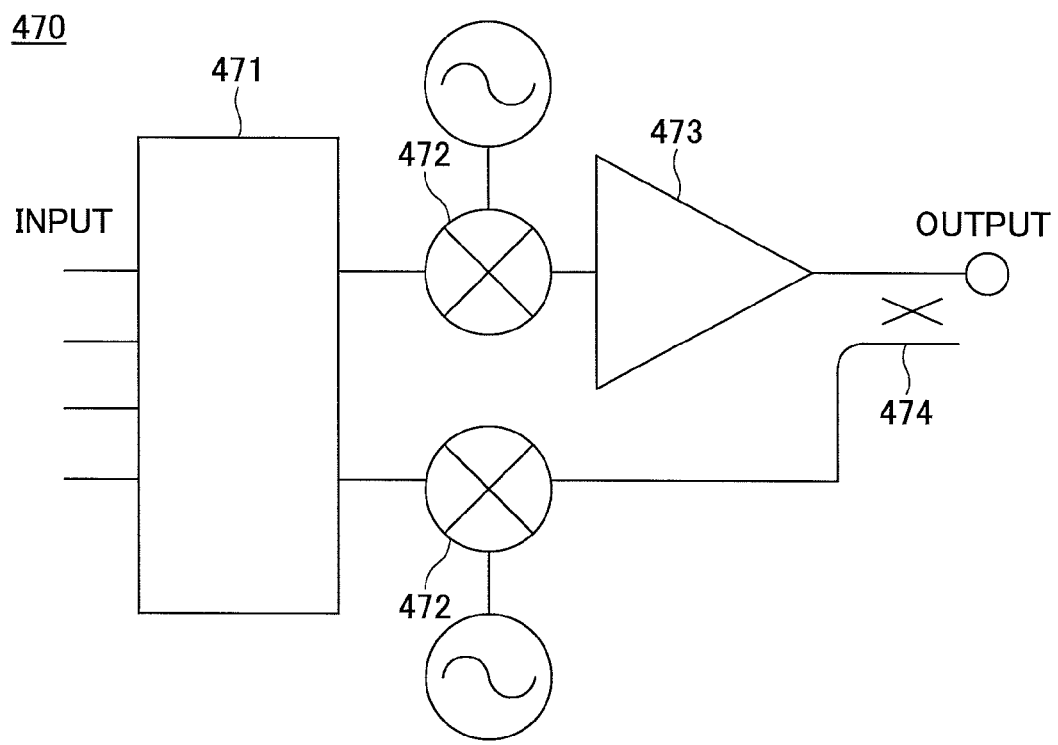
FIG. 17 illustrates a high-frequency amplifier according to the third embodiment.

Next, with reference to FIG. 17, a description is given of the high-frequency amplifier according to the present embodiment. A high-frequency amplifier 470 according to the present embodiment may be applied to a power amplifier of a base station of mobile phones. The high-frequency amplifier 470 includes a digital predistortion circuit 471, mixers 472, a power amplifier 473, and a directional coupler 474. The digital predistortion circuit 471 offsets the non-linear strains of input signals. The mixers 472 mix the input signals, whose non-linear strains have been offset, with AC signals. The power amplifier 473 amplifies the input signals that have been mixed with the AC signals. In the example of FIG. 17, the power amplifier 473 includes the semiconductor device according to the first embodiment or the second embodiment. The directional coupler 474 monitors input signals and output signals. In the circuit of FIG. 17, for example, the switch may be switched so that output signals are mixed with AC signals by the mixers 472 and sent to the digital predistortion circuit 471.

According to an aspect of the embodiments, a semiconductor device formed by a nitride semiconductor that becomes normally-off and a method of manufacturing the semiconductor device are provided, in which a low drain current flows in a state where a gate voltage is not applied, a high drain current flows in an on state, and the properties are uniform.

The present invention is not limited to the specific embodiments described herein, and variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a first semiconductor layer formed with i-GaN on a substrate;
a second semiconductor layer formed on the first semiconductor layer, wherein the first semiconductor layer and the second semiconductor layer have a common opening, wherein the opening forms
a recess in the first semiconductor layer, the recess having a depth that is smaller than a thickness of the first semiconductor layer, and
a through-hole through the second semiconductor layer;
a fifth semiconductor layer that fills the recess in the first semiconductor layer, the fifth semiconductor layer formed with GaN different from i-GaN;
a third semiconductor layer formed on the fifth semiconductor layer inside the through-hole in the second semiconductor layer;
a fourth semiconductor layer formed on the third semiconductor layer;
a gate electrode formed on the fourth semiconductor layer in an area immediately above the through-hole in the second semiconductor layer; and
a source electrode and a drain electrode formed in contact with the second semiconductor layer, wherein
the fourth semiconductor layer is formed with a p-type semiconductor material, and
the second semiconductor layer and the third semiconductor layer are formed with AlGaN, and the third semiconductor layer has a lower composition ratio of Al than that of the second semiconductor layer.

2. The semiconductor device according to claim 1, wherein a thickness of the third semiconductor layer is less than or equal to a thickness of the second semiconductor layer.

3. The semiconductor device according to claim 1, wherein the third semiconductor layer is formed with a material expressed as $Al_yGa_{1-y}N$, wherein a value of y satisfies $0 \leq y \leq 0.2$.

4. The semiconductor device according to claim 1, wherein the third semiconductor layer is formed to have a thickness of greater than or equal to 8 nm and less than or equal to 12 nm.

5. The semiconductor device according to claim 1, further comprising:
a cap layer formed on the second semiconductor layer, the cap layer being formed with a material including n-type GaN.

6. The semiconductor device according to claim 1, wherein the fourth semiconductor layer is formed with a material including GaN.

7. The semiconductor device according to claim 6, wherein Mg is doped in the fourth semiconductor layer.

8. The semiconductor device according to claim 1, wherein Si is doped in the second semiconductor layer and the third semiconductor layer.

9. A power unit comprising:
the semiconductor device according to claim 1.

10. An amplifier comprising:
the semiconductor device according to claim 1.

* * * * *